United States Patent [19]

Madan

[11] 4,396,793
[45] Aug. 2, 1983

[54] COMPENSATED AMORPHOUS SILICON SOLAR CELL

[75] Inventor: Arun Madan, Moraga, Calif.

[73] Assignee: Chevron Research Company, San Francisco, Calif.

[21] Appl. No.: 367,811

[22] Filed: Apr. 12, 1982

[51] Int. Cl.³ .................. H01L 31/06; H01L 31/18
[52] U.S. Cl. .................................. 136/255; 136/258; 357/2; 357/30; 427/39; 427/74; 427/86
[58] Field of Search .......... 136/255, 258 AM; 357/2, 357/15, 30, 59; 427/39, 74, 86

[56] References Cited

U.S. PATENT DOCUMENTS 4,217,148 8/1960 Carlson .................. 136/255

*Primary Examiner*—Aaron Weisstuch
*Attorney, Agent, or Firm*—D. A. Newell; E. J. Keeling; A. Stephen Zavell

[57] ABSTRACT

A hydrogenated amorphous silicon solar cell incorporating a compensated photoactive intrinsic region containing N-type and P-type dopants.

15 Claims, 2 Drawing Figures

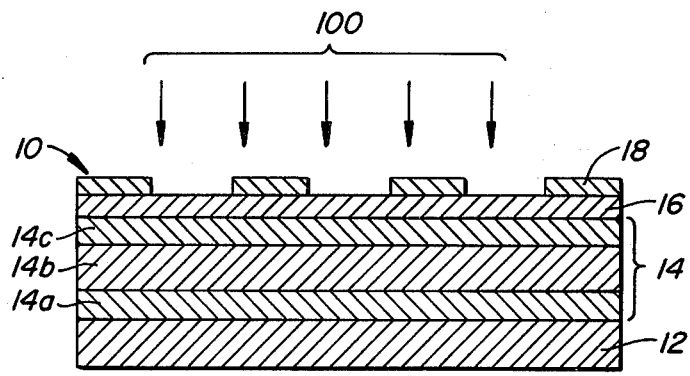
FIG._1.
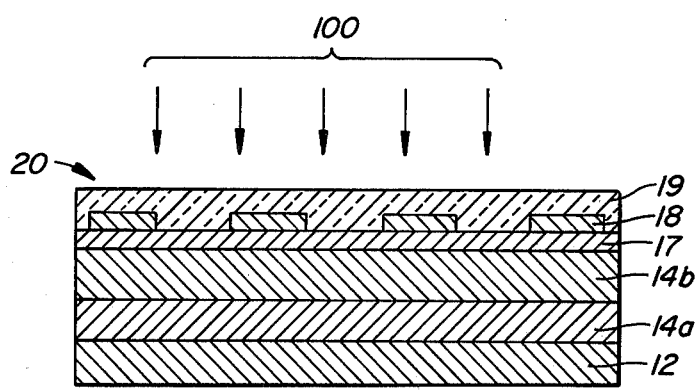
FIG._2.

COMPENSATED AMORPHOUS SILICON SOLAR CELL

BACKGROUND OF THE INVENTION

This invention relates to thin film solar cells. More specifically, this invention relates to thin film amorphous silicon solar cells.

Photovoltaic devices, such as solar cells, are capable of converting sunlight into usable electrical energy. The electrical energy conversion occurs as a result of what is well known in the solar cell field as the photovoltaic effect. Solar radiation impinging on a solar cell is absorbed by the semiconductor layer which generates electrons and holes. The electrons and holes are separated by a built-in electric field, for example, a rectifying junction, such as a P-I-N junction, in the solar cell. The electrons flow toward the N-type region and the holes flow toward the P-type region. The separation of the electrons and holes across the rectifying junction results in the generation of an electric current, known as the photocurrent, and an electric voltage, known as the photovoltage.

For maximum conversion efficiency of sunlight into electric energy, the semiconductor material should have a bandgap energy of about 1.5 electron volts. Photoactive intrinsic hydrogenated amorphous silicon based alloys, such as hydrogenated amorphous silicon, a-Si:H, or hydrogenated-fluorinated amorphous silicon, a-Si:F:H, has a bandgap energy, depending upon the method of fabrication, greater than about 1.7 eV. Doped hydrogenated amorphous silicon alloys incorporating P-type dopants have a bandgap energy which is closer to or below the ideal bandgap energy. However, the doping increases the defect state density of the material. U.S. Pat. No. 4,217,148, incorporated herein by reference, teaches adding a sufficient amount of a P-type conductivity modifier, such as boron, into the intrinsic amorphous silicon which is slightly N-type, to make the material less N-type and closer to a neutral state. However, incorporation of just enough P-type dopants to render the material intrinsic does not lower the bandgap of the material. Thus, it would be highly desirable to have a compensated cell wherein the intrinsic region had a lower bandgap which was more closely aligned with the optimum bandgap energy for absorption of solar radiation. It would also be desirable to have a cell wherein the greater absorption of the photoactive intrinsic region permits the fabrication of cells with a thinner active region and thus lowers the cost of the device and speeds the processing time. Furthermore, it would be desirable to have a compensated material fabricated by a method wherein the defects introduced during the doping process are offset by the increased absorption of the material due to the lower bandgap energy.

SUMMARY OF THE INVENTION

I have invented a hydrogenated amorphous silicon solar cell incorporating a photoactive intrinsic region containing both N-type and P-type dopants. The N-type and p-type dopants are incorporated only in a sufficient quantity to lower the bandgap of the photoactive intrinsic region and thus increase the absorption of the device without introducing sufficient defect state densities to offset the increased absorption. The concentration of the dopants need only be sufficient to permit a recombination lifetime in the photoactive intrinsic region which is greater than the transit time of the electron and holes to N-type and P-type regions respectively.

BRIEF DESCRIPTION OF THE DRAWINGS

FIG. 1 illustrates a P-I-N solar cell incorporating a compensated photoactive region.

FIG. 2 illustrates a Schottky barrier solar cell incorporating a compensated photoactive intrinsic region.

DETAILED DESCRIPTION OF THE INVENTION

The invention will be more clearly illustrated by referring to FIG. 1 which depicts a P-I-N solar cell designated as 10. The Pregion is the light incident region of the solar cell. Solar radiation 100, impinging on solar cell 10, forms a reference point for the incident surface of each layer region of the solar cell. The solar cell 10 includes an electrically conductive substrate 12 of stainless steel, molybdenum, titanium or other suitable materials. Optionally, the incident surface of the substrate 12 can be coated with a highly reflective layer of a metal such as aluminum or chromium to reflect light back into the semiconductor material. Another option is a substrate of glass coated with an electrically conductive material such as a transparent conductive oxide, hereinafter referred to as TCO, such as tin oxide, indium tin oxide and the like. If substrate 12 is glass coated with a TCO, solar radiation can pass through the substrate side and into the solar cell. In this situation, the solar cell can be operated as either a P-I-N solar cell or an N-I-P solar cell.

The active layer of the hydrogenated amorphous silicon alloy 14 is deposited upon substrate 12 by a glow discharge, chemical vapor deposition (CVD) or reactive sputtering process. The active layer 14 has regions 14a, 14b, and 14c of differing conductivity type. The region 14a contiguous to and deposited upon substrate 12, is doped $N^+$-type. The $N^+$-type conductivity of region 14a assures an ohmic contact to the conductive substrate 12. Region 14a has a thickness of from about 10 to about 40 nanometers and preferably about 25 nanometers with a bandgap of about 1.8 eV and an N-type doping concentration of a suitabel N-type dopant such as phosphorus in the form of $PH_3$ of from about 5,000 to 15,000 volume parts per million (Vol. ppm) and preferably about 10,000 vol. ppm. Region 14a is preferably graded in doping concentration from $N^+$-type contacting the substrate 12 to N-type at region 14b.

The region 14b of compensated photoactive intrinsic hydrogenated amorphous silicon is contiguous to region 14b. The region 14b has intrinsic properties but is doped with minor amounts of N-type and P-type dopants. The region has a lower bandgap energy than uncompensated amorphous silicon which is on the order of about 1.7–1.8 eV. Region 14b is the photoactive region of the solar cell and absorbs the solar radiation to create the holes and electrons which flow toward regions 14a and 14c. The photoactive region 14b incorporates sufficient P-type dopants such as boron in the form of $B_2H_6$ or other suitable dopants to reduce the bandgap of the material from the bandgap of intrinsic material without dopants or $N^+$-type material. A compensating amount of an N-type dopant is also added to region 14b to reduce the defect state density of the material.

The P-type dopants are added to reduce the optical bandgap to the desired bandgap energy, preferably about 1.5 eV. However, the P-type dopants lower the Fermi level of the material below that of uncompensated photoactive intrinsic hydrogenated amorphous silicon. Therefore, sufficient N-type dopants are also added to bring the Fermi level of the intrinsic hydrogenated silicon back up to the level of uncompensated hydrogenated amorphous silicon. Preferably, the level of N-type dopants is adjusted so that the final solar cell has a Fermi level that moves through the lowest possible density of states such as to give the widest possible depletion width for the compensated intrinsic material contacting either a Schottky barrier metal or a different doped semiconductor material such as P-type a-Si:H or P-type a-Si:F:H and the like. The N-type dopants are added to maximize the photoluminescence of the hydrogenated amorphous silicon coupled with a conductivity activation energy of about 0.6 eV to about 0.8 eV and preferably about 0.7 eV.

Region 14b has a thickness of from about 250 to about 400 nanometers, preferably about 350 nanometers. The increased absorption of the compensated region 14b permits the thickness of the layer to be reduced. An uncompensated intrinsic layer would have a thickness of from about 400 to 1000 nanometers and preferably about 500 nanometers. The doping concentration is from about 500 to 1500 vol. ppm of an N-type dopant and from about 500 to 1500 vol. ppm of a P-type dopant. A preferred amount of N-type and P-type dopants is from about 800 to 1000 vol. ppm. The photoactive region should have a bandgap energy less than about 1.6 eV and preferably between about 1.4 to about 1.6 eV and most preferably about 1.5 eV. The exact concentration pairing of the N-type and P-type dopants should be adjusted in region 14b so that the recombination time is greater than the transit time of the electrons and holes out of the photoactive intrinsic region.

A region 14c of P-type hydrogenated amorphous silicon is contiguous to the improved region 14b. Region 14c is a hydrogenated amorphous silicon region with a P-type conductivity modifier such as boron, aluminum, gallium, indium, or other suitable P-type dopants. Preferably, region 14c is P-type at region 14b P+-type at layer 16. The region 14c should ohmically contact layer 16. The region 14c is typically from about 20 to about 50 nanometers in thickness and preferably about 30 nanometers in thickness. The region 14c of P-type hydrogenated amorphous silicon has a bandgap energy of less than about 1.2 eV with a P-type doping concentration of about 20,000 to 40,000 vol. ppm and preferably about 30,000 vol. ppm. It should be noted that wide bandgap energy P-type hydrogenated amorphous silicon, i.e. greater than 1.8 eV has been fabricated but the material requires $NH_3$ or $CH_4$ or $N_2O$ gas in the growth atmosphere. when the P-type region forms the incident region of the solar cell, a wide bandgap material is preferred.

A transparent electrode layer 16 of TCO or other suitable material contacts the region 14c. The TCO layer 16 should be transparent to solar radiation and form an ohmic contact to region 14c. Optionally, the layer 16 can form an integral anti-reflection coating. The layer 16 can also be thin transparent metals such as gold or gold and silver and the like. Preferably the layer 16 has a series resistance less than about 60 Ohms per square ($\Omega/\Box$), more preferably less than about 30 $\Omega/\Box$ and most preferably less than about 20 $\Omega/\Box$. The layer 16 is typically on the order of a quarter wavelength in thickness or about 70 nanometers thick.

A grid electrode 18 is deposited on the TCO layer 16. The grid electrode withdraws the current generated during illumination of solar cell 10 by solar radiation 100. The grid electrode 18 can be platinum, gold, silver or other suitable highly conductive material.

An alternative embodiment of the invention is illustrated in FIG. 2. Solar cell 20 has the same substrate 12, and regions 14a and 14b and grid electrode 18 as solar cell 10 and FIG. 1. However, solar cell 20 incorporates a Schottky barrier metal layer 17 which contacts the photoactive compensated intrinsic region 14b and an optional antireflection coating 19 of $SiO_2$, $ZrO_2$, $Nb_2O_5$, or like material which is transparent to solar radiation. In solar cell 20, the photocurrent generated during illumination is collected and withdrawn by the substrate 12, layer 17 and the grid electrode 18. Optionally, and not illustrated, an insulating layer such as $Nb_2O_5$, $SiO_2$, and $Ta_2O_5$ on the order of about 2 to 5 nanometers, could be inserted between region 14b and layer 17 to form what is known in the art as an MIS device. A preferred solar cell would also include a thin reflective metal layer of aluminum or chromium on the substrate 12.

The use of minor amounts of P-type dopants alone to make the slightly N-type intrinsic amorphous silicon truly intrinsic does not sufficiently lower the bandgap of the photoactive region toward the ideal bandgap energy 1.5 eV. Additional P-type dopants lower the bandgap energy and increase the adsorption of the photoactive region; however, the photoluminescence decreases. Adding N-type dopants compensates the P-type dopants and increases the photoluminescence. The amount of the dopants must be adjusted so that the increase in absorption is not offset by increase in defect sites due to the incorporation of the P-type dopants into the photoactive region.

The cells can be fabricated by methods known in the art such as those disclosed in U.S. Pat. Nos. 4,064,521, 4,217,148; 4,226,898, all of said patents completely incorporated herein by reference.

For example, P-type or P+-type hydrogenated amorphous silicon can be fabricated from $SiH_4 + B_2H_6$, $SiH_4 + H_2 + B_2H_6$, $SiF_4 + H_2 + B_2H_6$, $SiCl_2H_2 + H_2 + B_2H_6$, the halogenated silicon gases plus hydrogen and a P-type dopant, and the like. Wide bandgap P-type material can be fabricated from $SiH_4 + CH_4 + B_2H_6$, $SiH_4 + N_2O + B_2H_6$, $SiH_4 + NH_3 + B_2H_6$, the halogenated silicon gases and $CH_4$ or $NH_3$, and the like. The compensated intrinsic amorphous silicon can be fabricated from $SiH_4 + B_2H_6 + PH_3$, $SiF_4 + H_2 + B_2H_6 + PH_3$, $SiH_4 + H_2 + B_2H_6 + PH_3$, other halogenated silicon gases, hydrogen, diborane, phosphine, and the like. N-type or N+-type material can be fabricated from the same materials as the P-type material; however, $PH_3$, $AsH_3$ or other suitable N-type dopant is substituted for the P-type dopant. Suitable substrate temperatures are from about 250°–350° C., with a power density of 0.2–2 w/cm$^2$, a flow rate of 5–50 SCCM, and a deposition pressure of 0.1–2 Torr.

Suitable glow discharge apparatus are the PWS 450 Coyote, a product of Pacific Western Systems, Inc., Mountain View, Calif., or a Model 2306 of Plasma Systems, Inc., a subsidiary of Plasma-Therm, Inc. Woburn, Mass.

More specifically, a conductive substrate is placed in a glow discharge apparatus, and the pressure is reduced to about $10^{-6}$ Torr. Thereafter, the substrate is heated to about 280° C. Silane or silane plus methane or $SiH_4+NH_3$ and phosphine are introduced into the chamber at a flow rate of about 20 SCCM to establish a pressure of about 0.5 Torr. Thereafter, the glow discharge electrodes are energized to a power of about 1 $W/cm^2$ and a layer of N-type hydrogenated amorphous silicon is deposited to a thickness of about 10 to about 40 nanometers. Thereafter, the concentration of the N-type dopant is reduced and a P-type dopant such as $B_2H_6$ is introduced such that the film has a concentration of boron and phosphorus on the order of from about 500 to about 1500 vol. ppm. The photoactive intrinsic region takes about 20 minutes to grow to about a 350-nanometer thick layer. The improved compensated region has a bandgap of about less than about 1.6 eV. If the material were not compensated, the bandgap energy would be about 1.8 eV.

Thereafter, the N-type dopant is terminated and the P-type dopant concentration is increased to grow a thin highly doped P-type, preferably a $P^+$-type region about 30 nanometers thick containing about 30,000 vol. ppm of the P-type dopant.

Alternatively, the hydrogenated amorphous silicon can be halogenated, i.e., a-Si:F:H by fabricating the solar cell with $SiF_4$ and $H_2$ in a ratio of about 8 parts $SiF_4$ to 1 part $H_2$.

After the deposition of the hydrogenated amorphous silicon layer, a TCO layer is deposited onto the hydrogenated amorphous silicon layer and then a grid electrode is deposited onto the TCO layer by methods known in the art, such as evaporation, photolithography, and like methods. Alternatively, a cermet layer as taught in U.S. Pat. No. 4,162,505, incorporated herein by reference, can be incorporated into the cell.

Although the fabrication has been illustrated for a P-I-N hydrogenated amorphous silicon solar cell, the compensated region of intrinsic hydrogenated amorphous silicon can also be incorporated into a Schottky barrier solar cell, a heterojunction solar cell, an MIS solar cell, an NIP solar cell, or similar semiconductor solar cell which incorporates an intrinsic region of hydrogenated amorphous silicon. The hydrogenated amorphous silicon can also incorporate a halogen. The solar cell can be fabricated as a battery, as disclosed in U.S. Pat. No. 4,316,049, incorporated herein by reference. Modifications which would be obvious to one of ordinary skill in the solar cell art are contemplated to be within the scope of the invention.

What is claimed is:

1. In a hydrogenated amorphous silicon solar cell which comprises an electrically conductive substrate, a layer of hydrogenated amorphous silicon having regions of differing conductivity with at least one region of photoactive intrinsic hydrogenated amorphous silicon, said layer of hydrogenated amorphous silicon having opposed first and second major surfaces where said first major surface contacts said electrically conductive substrate, and means for electrically contacting said second major surface, the improvement wherein the photoactive intrinsic hydrogenated amorphous silicon region is compensated with suitable N-type and P-type dopants to reduce the bandgap energy of the material to less than about 1.6 eV, said doping concentration adjusted such that the recombination lifetime of the photoactive intrinsic region is greater than the transit time for the holes and electrons generated in said photoactive intrinsic region out of said region during illumination of the solar cell.

2. The solar cell according to claim 1 wherein the P-type and N-type dopant concentrations in said compensated intrinsic region are from about 500 to about 1500 vol. ppm.

3. The solar cell according to claim 2 wherein the photoactive intrinsic region has a bandgap energy of about 1.5 eV.

4. The solar cell according to claim 1 wherein the cell is a P-I-N solar cell.

5. The solar cell according to claim 1 wherein the solar cell is an NIP solar cell.

6. The solar cell according to claim 1 wherein said cell comprises an $N^+$-type region contacting the electrically conductive substrate, a photoactive compensated intrinsic region contacting said $N^+$-type region and a Schottky barrier metal layer contacting the photoactive intrinsic region to form a Schottky barrier solar cell.

7. The solar cell according to claim 1, 3, 4 or 5 wherein said layer of hydrogenated amorphous silicon includes a P-type layer fabricated from an atmosphere comprising silane and diborane; silane, ammonia and diborane; silane, methane and diborane; or silane, nitrous oxide and diborane.

8. The solar cell according to claim 1 or 3 wherein the photoactive compensated intrinsic region is fabricated from an atmosphere comprising silane, diborane, and phosphine.

9. The solar cell according to claim 8 wherein the hydrogenated amorphous silicon further incorporates a halogen.

10. The solar cell according to claim 1 wherein the photoactive compensated intrinsic hydrogenated amorphous silicon region further includes a halogen.

11. A method of reducing the bandgap energy of a photoactive intrinsic hydrogenated amorphous silicon region incorporated into a hydrogenated amorphous silicon solar cell, said method comprising:
incorporating a suitable P-type and N-type dopants during the growth of said layer in amounts sufficient to reduce the bandgap energy of the photoactive intrinsic hydrogenated amorphous silicon region to less than about 1.6 eV, said concentrations of said N-type and P-type dopants also being sufficient to fabricate a photoactive intrinsic region wherein the recombination lifetime is greater than the transit time of holes and electrons out of said photoactive region during illumination.

12. The method according to claim 11 wherein the N-type and P-type dopants are incorporated in an amount sufficient to fabricate an intrinsic region containing N-type and P-type dopant concentrations on the order of 500 to about 1500 vol. ppm.

13. The method according to claim 12 wherein the substrate temperature is from about 250° C. to about 350° C. during the deposition.

14. The method according to claim 13 wherein the growth atmosphere for hydrogenated amorphous silicon comprises silicon-hydrogen-halogen gases.

15. The method according to claim 14 wherein the atmosphere is $SiF_4$ and $H_2$ plus dopant gases.

* * * * *